United States Patent
Long et al.

(10) Patent No.: US 7,364,772 B2
(45) Date of Patent: *Apr. 29, 2008

(54) METHOD FOR COATING AN ORGANIC LAYER ONTO A SUBSTRATE IN A VACUUM CHAMBER

(75) Inventors: Michael Long, Hilton, NY (US);
Jeremy M. Grace, Penfield, NY (US);
Bruce E. Koppe, Caledonia, NY (US);
Dennis R. Freeman, Spencerport, NY (US); Neil P. Redden, Sodus Point, NY (US); Robert F. Zwaap, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 837 days.

This patent is subject to a terminal disclaimer.

(21) Appl. No.: 10/805,847

(22) Filed: Mar. 22, 2004

(65) Prior Publication Data

US 2005/0208216 A1    Sep. 22, 2005

(51) Int. Cl.
*C23C 16/455* (2006.01)
(52) U.S. Cl. .................. 427/255.6; 427/294
(58) Field of Classification Search ............. 427/248.1, 427/255.6; 118/719
See application file for complete search history.

(56) References Cited

U.S. PATENT DOCUMENTS 2,447,789 A    8/1948    Barr (Continued)

FOREIGN PATENT DOCUMENTS

EP    0 422 355    9/1990

(Continued)

OTHER PUBLICATIONS

Patent Abstracts of Japan vol. 005, No. 204 (C-085), Dec. 24, 1981 & JP 56 123368, Sep. 28, 1981 abstract.

(Continued)

*Primary Examiner*—Bret Chen
(74) *Attorney, Agent, or Firm*—Raymond L. Owens

(57) ABSTRACT

A vapor deposition source for use in vacuum chamber for coating an organic layer on a substrate of an OLED device, includes a manifold including side and bottom walls defining a chamber for receiving organic material, and an aperture plate disposed between the side walls, the aperture plate having a plurality of spaced apart apertures for emitting vaporized organic material; the aperture plate including conductive material which in response to an electrical current produces heat; means for heating the organic material to a temperature which causes its vaporization, and heating the side walls of the manifold; and an electrical insulator coupling the aperture plate to the side walls for concentrating heat in the unsupported region of the aperture plate adjacent to the apertures, whereby the distance between the aperture plate and the substrate can be reduced to provide high coating thickness uniformity on the substrate. A method for coating an organic layer on onto a substrate in a vacuum chamber includes providing a manifold including side and bottom walls defining a chamber for receiving organic material. and an aperture plate disposed between the side walls, the aperture elate having a plurality of spaced apart apertures for emitting vaporized organic material; heating the organic material to a temperature which causes its vaporization, and the side walls of the manifold, the aperture plate includes a first aperture plate emissive surface that radiates energy into the chamber and a second aperture plate emissive surface that radiates less energy to the substrate wherein the second aperture elate emissive surface has an emissivity lower than the first aperture plate emissive surface; and concentrating heat in an unsupported region of the aperture plate adjacent to the apertures by providing an electrical insulator coupling the aperture plate to the side walls.

6 Claims, 6 Drawing Sheets

U.S. PATENT DOCUMENTS

| | | | |
|---|---|---|---|
| 4,769,292 A | | 9/1988 | Tang et al. |
| 4,854,263 A | * | 8/1989 | Chang et al. ............... 118/715 |
| 4,877,505 A | * | 10/1989 | Bergmann ............. 204/192.38 |
| 4,885,211 A | | 12/1989 | Tang et al. |
| 6,237,529 B1 | * | 5/2001 | Spahn ....................... 118/726 |
| 6,749,906 B2 | * | 6/2004 | Van Slyke ................. 427/591 |
| 6,893,939 B1 | * | 5/2005 | Grace et al. ................ 438/424 |
| 6,936,551 B2 | * | 8/2005 | Moghadam et al. ........ 438/780 |
| 7,166,169 B2 | * | 1/2007 | Freeman et al. ............ 118/726 |
| 2004/0042770 A1 | | 3/2004 | Choe et al. |

FOREIGN PATENT DOCUMENTS

| | | |
|---|---|---|
| EP | 0982411 | 3/2000 |
| EP | 1 342 808 | 9/2003 |
| EP | 1 491 653 | 12/2004 |
| WO | WO 03/025245 | 3/2003 |
| WO | 03/062486 | 7/2003 |
| WO | 03/079420 | 9/2003 |

OTHER PUBLICATIONS

"27.2 Linear source deposition of organic layers for full-color OLED", by Steven VanSlyke et al., 2002 SID International Symposium Digest of Technical Papers. Boston, MA., May 21-23, 2002.

* cited by examiner

METHOD FOR COATING AN ORGANIC LAYER ONTO A SUBSTRATE IN A VACUUM CHAMBER

CROSS REFERENCE TO RELATED APPLICATIONS

Reference is made to commonly assigned U.S. patent application Ser. No. 10/352,558 filed Jan. 28, 2003 by Jeremy M. Grace et al., entitled "Method of Designing a Thermal Physical Vapor Deposition System", U.S. patent application Ser. No. 10/784,585 filed Feb. 23, 2004, now U.S. Pat. No. 7,232,588, by Michael Long et al, entitled "Device and Method for Vaporizing Temperature Sensitive Materials", U.S. patent application Ser. No. 10/805,980 filed Mar. 22, 2004, now U.S. patent application Ser. No. 7,238,389, by Michael Long et al, entitled "Vaporizing Fluidized Organic Materials", the disclosures of which are herein incorporated by reference.

FIELD OF THE INVENTION

The present invention relates to the field of physical vapor deposition where a source material is heated to a temperature so as to cause vaporization and create a vapor plume to form a thin film on a surface of a substrate.

BACKGROUND OF THE INVENTION

An organic light emitting device (OLED) includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. Linear deposition sources of the prior art typically are capable of achieving thickness uniformity specifications of ±10% and have more recently achieved ±4%. This has been adequate for early OLED devices but is not adequate for OLED devices that rely on the organic layer stack thickness to act as a resonance cavity and thereby increase the intensity of the emitted light. For these devices to be effective, it is necessary to control the cavity thickness to within ±1 to 2%.

To achieve these thickness uniformity objectives, it is necessary to control the uniformity of the vapor flow through the source exit aperture or apertures and to additionally tailor the flow in a manner that compensates for losses at the edges of the substrate. The observed film thickness from a source with uniform vapor flow along its length depositing a film on a equal size substrate shows a fairly uniform central region that is bordered by end regions where the film thickness declines at an increasing rate toward the edge of the substrate.

Increasing the distance from the source to the substrate, known as the throw distance, and increasing the length of the source relative to the width of the substrate has the effect of increasing the thickness uniformity over the substrate. The prior art has achieved increased thickness uniformity by increasing the throw distance and using sources that may be as much as twice as wide as the substrate. For example, International Patent Application WO 2003/062486 discusses the need to increase throw distance as the substrate size increases. This strategy requires large deposition chambers, results in very low deposition rates on the substrate and wastes the vast majority of sublimated organic material.

To reduce the disparity between the length of the source and the width of the substrate, dog-bone shaped slit apertures and the use of discrete apertures whose size or packing density increases toward the ends of the source have been described by Lee et al. in International Patent Application WO 03/079420 A1 to deliver higher vapor flow at the ends of the substrate and thereby compensate for the usual thickness decline. This practice improves the thickness uniformity, but it has proven impossible to reduce a residual sinusoidal thickness variation at the end of the substrate to the 1% level.

For linear sources operated at short throw distances, there is less thickness variation of the deposited film between the ends of the substrate and the center, but local variations in vapor plume density become apparent in the deposited film. This is especially true in sources where the exit aperture is composed of multiple discrete orifices. Perhaps more problematic to the substrate, the organic film, and any masks used to define pixels, is the increased heat radiated from the source to the substrate at short throw distances. The increased heating alters the organic film nucleation process and dilates the substrate and mask, making it impossible to maintain precise alignment.

SUMMARY OF THE INVENTION

It is therefore an object of the present invention to achieve increased thickness uniformity in depositing vaporized organic material while reducing the amount of organic material lost through waste.

This object is achieved by a vapor deposition source for use in vacuum chamber for coating an organic layer on a substrate of an OLED device, comprising:

(a) a manifold including side and bottom walls defining a chamber for receiving organic material, and an aperture plate disposed between the side walls, the aperture plate having a plurality of spaced apart apertures for emitting vaporized organic material;

(b) the aperture plate including conductive material which in response to an electrical current produces heat;

(c) means for heating the organic material to a temperature which causes its vaporization, and heating the side walls of the manifold; and (d) an electrical insulator coupling the aperture plate to the side walls for concentrating heat in the unsupported region of the aperture plate adjacent to the apertures, whereby the distance between the aperture plate and the substrate can be reduced to provide high coating thickness uniformity on the substrate.

It is an advantage of the present invention that it increases the deposition uniformity of vaporized organic material while reducing the heat radiated toward a substrate. It is a further advantage that only a small portion of organic material is exposed to vaporization temperatures at a given time, thereby minimizing material degradation. By operating at a reduced throw distance, the material utilization is improved as well as the apparent deposition rate. More of the organic material is deposited on the substrate and less on the walls of the vacuum chamber.

DETAILED DESCRIPTION OF THE INVENTION

Figure 1:
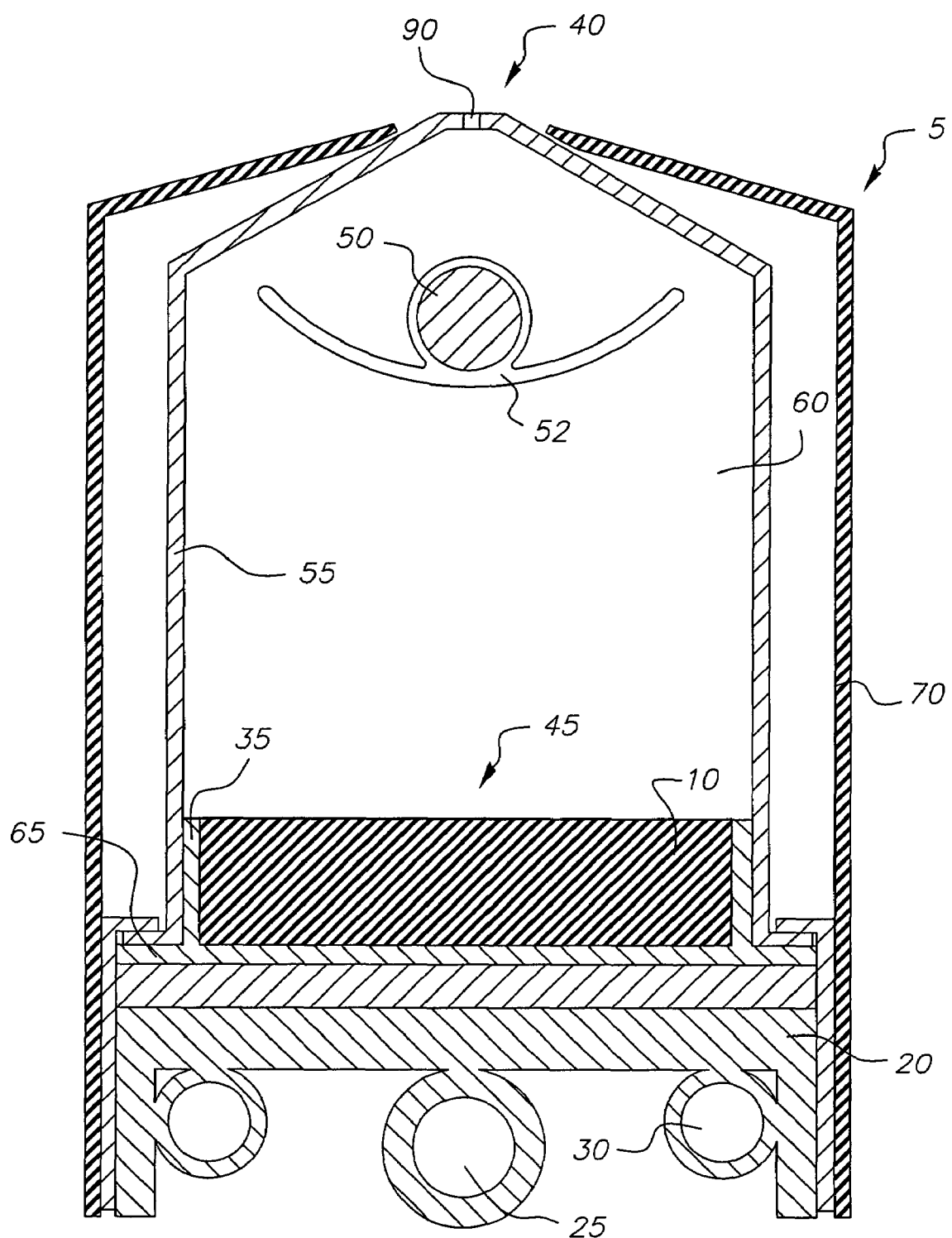
FIG. 1 is a cross-sectional view of one embodiment of a device according to the present invention.

Turning now to FIG. 1, there is shown a cross-sectional view of one embodiment of a device according to the present invention. Vapor deposition source 5 is a device for vaporizing organic materials and thereby coating an organic layer onto a substrate surface of an OLED device to form a film. Vapor deposition source 5 includes manifold 60, which is an enclosed volume for containing vaporized organic material. Manifold 60 is bounded by aperture plate 40, side walls 55 and bottom wall 65. Side walls 55 are understood to include any necessary end walls to make manifold 60 completely enclosed. Side walls 55 and bottom wall 65 define chamber 45 for receiving organic material 10. The upper portion of manifold 60 engages the lower portion through a seal area 35. The seal can take the form of a labyrinth seal, a face seal or an O-ring seal. It is not necessary for the seal to initially be gas tight, since, due to the relatively low temperature in the seal area, escaping vapors will quickly condense to form a vapor tight seal. Aperture plate 40 is disposed between side walls 55 and includes a plurality of spaced apart apertures 90 for emitting vaporized organic material. Manifold 60 is shaped so that aperture plate 40 is closest to the substrate. The exact nature of aperture plate 40 will become apparent below. Vapor deposition source 5 also includes one or more radiation shields 70 and can include heater 25 and control passages 30 as part of base block 20.

Organic material 10 is preferably either a compacted or pre-condensed solid. However, organic material in powder form is also acceptable. Organic material 10 can include a single component, or can include two or more organic components, each one having a different vaporization temperature.

A heating element 50 includes a means for heating the top surface of organic material 10 by radiant energy to a temperature which causes its vaporization. Heating element 50 also radiantly heats side walls 55 of manifold 60. Heating element 50 is supported near its ends by the walls of manifold 60 and heats these walls by conduction to be at a temperature at least as high as the side walls 55 that are heated radiantly. This wall heating substantially eliminates charge migration and redistribution of organic material 10 towards the ends of chamber 45 and allows a stable vaporization rate to be achieved quickly. The emissivity of the external surface of heating element 50 is preferably greater than 0.7 so as to minimize the temperature of the heating element required to achieve a given vaporization rate. Emissivity or emittance is defined as the ratio of thermal energy emitted by given surface to the thermal energy emitted by a blackbody at the same temperature. Nichrome, graphite, chromium oxide and many other metal oxide and ceramic coatings are suitable high-emissivity materials. Heating element 50 can include a shroud 52 to increase the radiant area of heating element 50 and thereby allow a lower heater operating temperature. Shroud 52 should similarly have a high emissivity and can further be shaped to control the distribution of radiant energy across the surface of the organic material. It is further possible to maximize the radiant heating efficiency through the use of tuned infrared emission spectra that match the absorption spectra of organic material 10. This is accomplished through the fabrication of photonic bandgap microstructures on the surface of radiant heating element 50. Photonic bandgap structures are used as optical and infrared filters because they offer controllable, narrow band absorbance. Daly et al. in *Mater. Res. Soc. Symp.*, 004, 0.7 (1999) report on the use of lithographically defined, sub-micrometer scale, silicon surface structures to control the thermal emittance of surfaces and therefore the radiant heat transfer. Daly has used these features for applications in gas absorption spectroscopy.

A steep thermal gradient on the order of 10° C./mm is created through the thickness of organic material 10. The top surface of organic material 10 vaporizes while the underlying material remains relatively cool. A pressure develops in manifold 60 as vaporization continues and streams of vaporized organic material exit manifold 60 through the series of apertures 90. The plume is herein defined as the vapor cloud exiting vapor deposition source 5. The conductance along the length of manifold 60 is designed to be roughly two orders of magnitude larger than the sum of the aperture conductances as described by Grace, et. al. in above-cited commonly-assigned U.S. patent application Ser. No. 10/352, 558. This conductance ratio promotes good pressure uniformity within manifold 60 and thereby minimizes flow non-uniformities through apertures 90 distributed along the length of vapor deposition source 5 despite potential local non-uniformities in vaporization rate.

Figure 2:
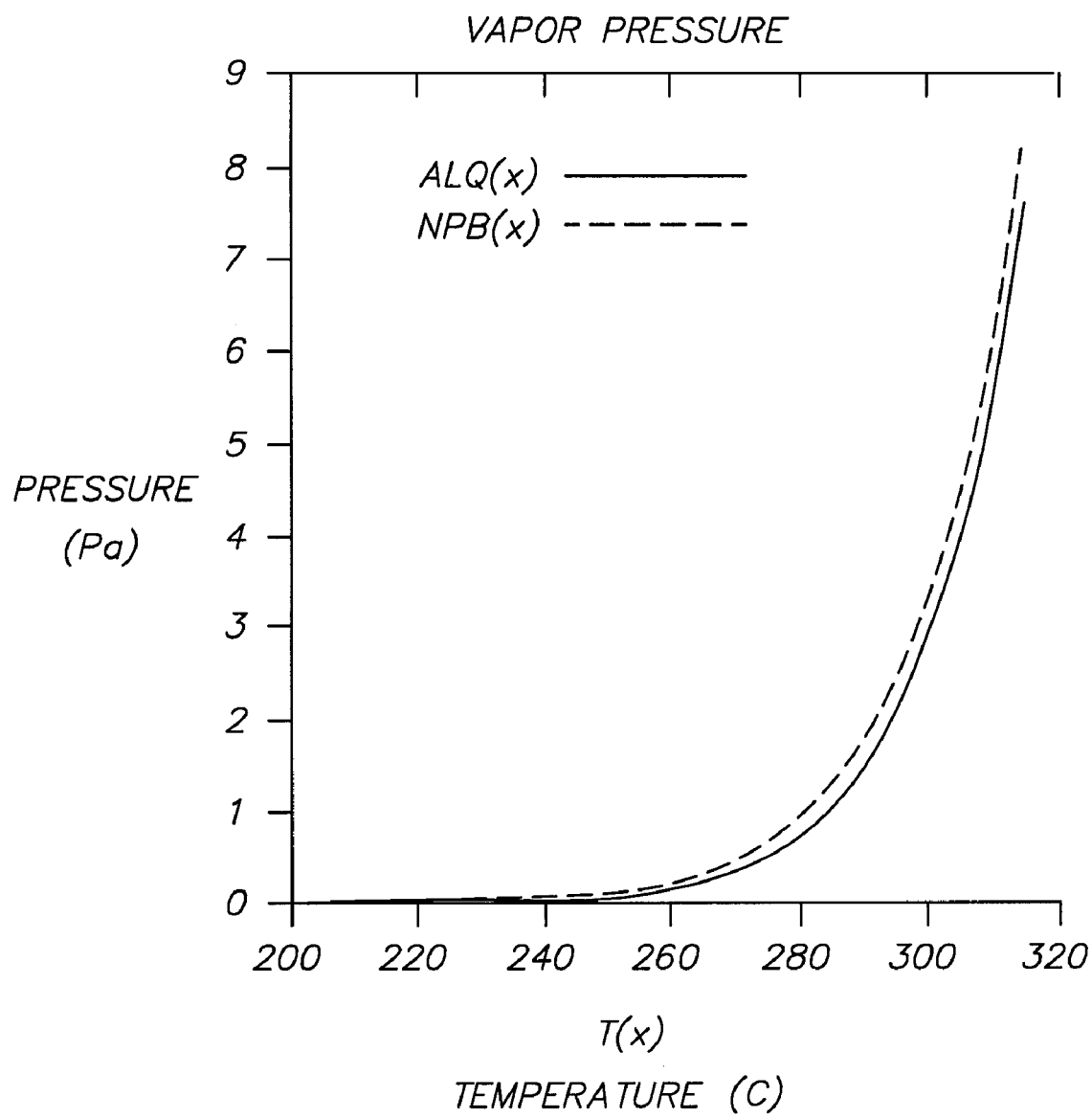
FIG. 2 shows a graphical representation of vapor pressure vs. temperature for two organic materials.

In some cases, it can be desirable to heat organic material 10 to a temperature below its vaporization temperature before heating to vaporization with heating element 50. Organic material 10 is in close thermal contact with bottom wall 65 and thereby with base block 20. The bulk of organic material 10 can be heated by a second heating means, e.g. heater 25 until it is a temperature below its vaporization temperature. The vaporization temperature can be determined by various means. For example, FIG. 2 shows a graphical representation of vapor pressure versus temperature for two organic materials commonly used in OLED devices. The vaporization rate is proportional to the vapor pressure, so for a desired vaporization rate, the data in FIG. 2 can be used to define the required heating temperature corresponding to the desired vaporization rate. Heating element 50 then heats organic material 10 to a temperature above its vaporization temperature, or the vaporization temperature of each of the organic components thereof. Because a given organic component vaporizes at different rates over a continuum of temperatures, there is a logarithmic dependence of vaporization rate on temperature. In choosing a desired deposition rate, one also determines a necessary vaporization temperature of organic material 10. The residence time of organic material 10 at elevated temperature, that is, at the rate-dependent vaporization temperature, is substantially less than prior art devices and methods, which permits heating organic material 10 to higher temperatures than in the prior art. Thus, the current device and method can achieve substantially higher vaporization rates, without causing appreciable degradation of organic material 10.

Radiant heating element 50 heats aperture plate 40 and side walls 55 of manifold 60. To reduce heat emitted externally and radiate less energy to the substrate, the exterior portions of aperture plate 40 and side walls 55 of manifold 60 can be made from or coated with a low-emissivity material. Polished tantalum, tungsten, titanium, and stainless steel are examples of suitable low-emissivity materials. To improve the efficiency of heating organic material 10 by radiating energy into chamber 45, the interior portions of aperture plate 40 and side walls 55 of manifold 60 can be made from or coated with a high-emissivity material, as described above.

The temperature of the manifold chamber must be further controlled. Heat absorbed by side walls 55 can be conducted to bottom wall 65 and organic material 10, thus raising the temperature of the bulk of organic material 10 to undesirable levels. To prevent this, the lower portion of manifold 60 and the manifold chamber is actively controlled to be a uniform temperature along its length and width by virtue of contact with base block 20. Control passages 30 through base block 20 allow the flow of a temperature control fluid, that is, a fluid adapted to either absorb heat from or deliver heat to base block 20. This can be accomplished by varying the temperature of the fluid in control passage 30. The fluid can be a gas or a liquid or a mixed phase. Vapor deposition source 5 includes a means for pumping fluid through control passages 30. Such pumping means, not shown, are well-known to those skilled in the art. In this way, the lower portion of manifold 60 is the coolest portion of vapor deposition source 5 in contact with organic material 10. In another embodiment, control passages 30 can include the second heating means. Thus, control passages 30 can heat the bulk of organic material 10 before vaporization, and can subsequently be used to actively control the temperature of the lower portion of the manifold chamber.

One or more radiation shields 70 are located adjacent to the heated manifold 60 and spaced closely to apertures 90 for the purpose of minimizing the area of aperture plate 40 and manifold 60 that is radiating energy to the facing target substrate. The upper portion of radiation shields 70 is designed to lie below the plane of the apertures 90 for the purpose of minimizing vapor condensation on their relatively cool surfaces and minimizing the risk of radiation shields 70 becoming covered with condensed organic material. Radiation shields 70 are thermally connected to base block 20 for the purpose of drawing heat away from the radiation shields 70.

Although one preferred embodiment has been the use of vapor deposition source 5 with a powder or compressed material that sublimes when heated, in some embodiments organic material 10 can be a material that liquefies before vaporization and can be a liquid at the temperature at which the bulk of organic material 10 is held.

In practice, vapor deposition source 5 can be used as follows. A quantity of organic material 10, which can include one or more components, is provided into chamber 45 of vapor deposition source 5. Organic material 10 can be actively maintained below the vaporization temperature of each of its organic components. Heating element 50 heats the surface of organic material 10 to a temperature above its vaporization temperature or above the vaporization temperature of each of the components thereof, whereby organic material 10 vaporizes and forms a film on a substrate surface. When organic material 10 includes multiple components, each component simultaneously vaporizes.

Figure 3:
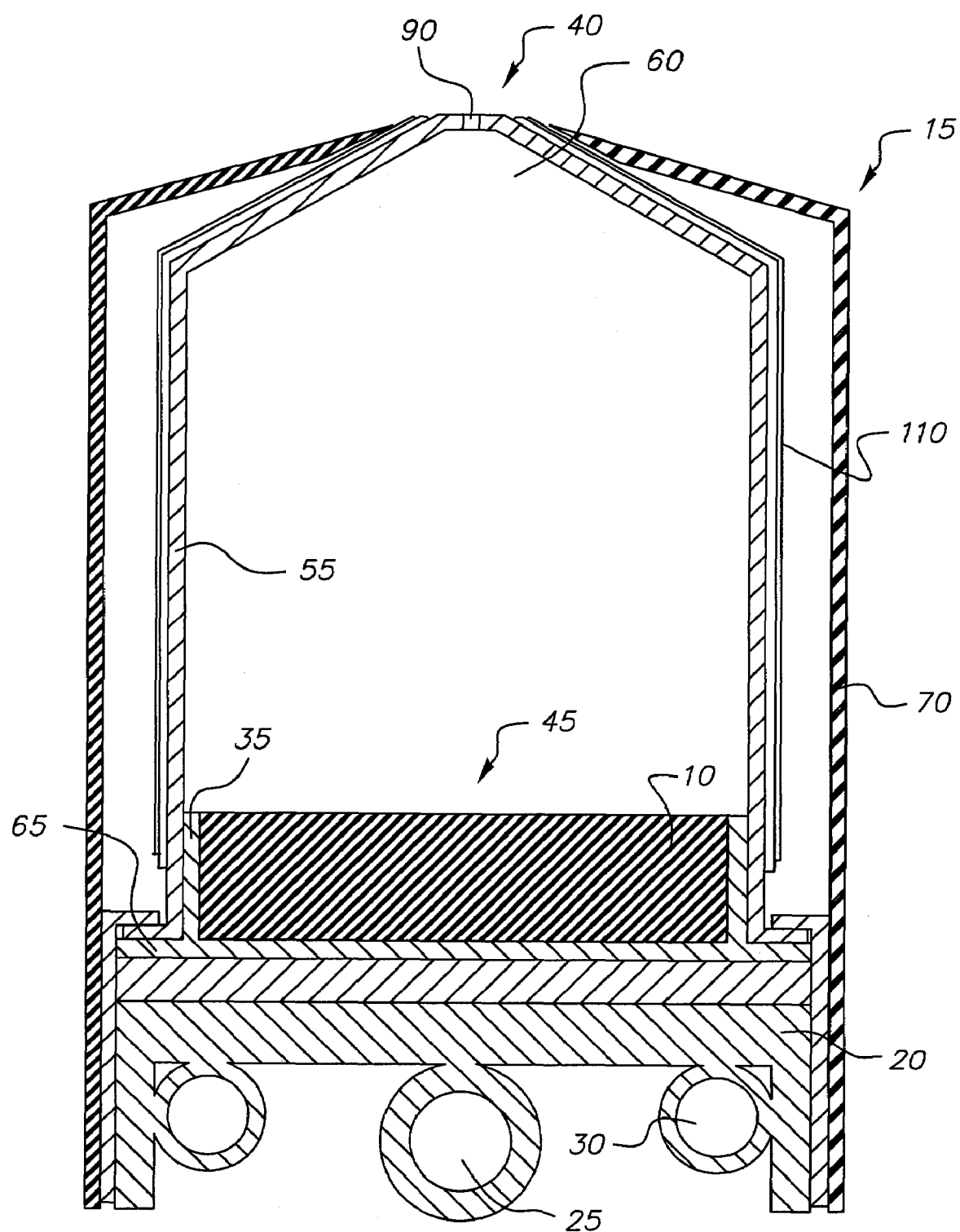
FIG. 3 is a cross-sectional view of another embodiment of a device according to the present invention.

FIG. 3 shows a cross-sectional view of a second embodiment of a device according to the present invention. Vapor deposition source 15 is constructed much as vapor deposition source 5, except that a heating element 110 is used instead of heating element 50. Heating element 110 is constructed on the inside or outside surface of side walls 55 of manifold 60. An optional insulator later can be used between side walls 55 and heating element 110. Heating element 110 is a means for heating side walls 55, which thereby radiatively heat organic material 10 to a temperature which causes its vaporization. The temperature of sidewalls 55 of manifold 60 must remain heated by heating element 110 above the condensation temperature of the vapor.

Figure 4:
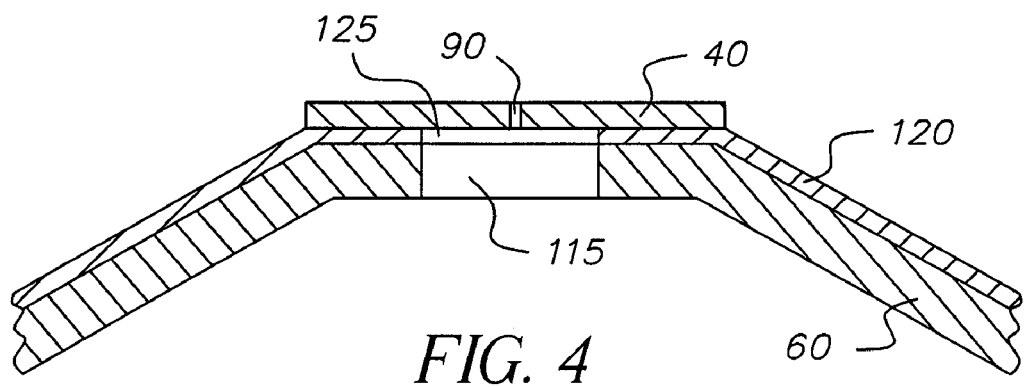
FIG. 4 is a cross-sectional view of one embodiment of an aperture according to the present invention.

FIG. 4 illustrates one embodiment of the aperture plate according to the present invention. Manifold 60 has a series of manifold apertures 115 that are coaxial with but somewhat wider and longer than the desired dimensions of apertures 90. An electrical insulator 120 is attached to manifold 60 and has insulator apertures 125, which are substantially the same size as and aligned with manifold apertures 115. Aperture plate 40, having a series of precisely sized apertures 90 of the dimensions required to achieve the desired flow rates, is attached to insulator 120 such that apertures 90 are coaxial with manifold apertures 115 and insulator apertures 125. A portion of aperture plate 40 immediately adjacent to each of its apertures 90 is thereby unsupported while insulator 120 thermally couples the remainder of aperture plate 40 to side walls 55 of manifold 60. Aperture plate 40 is the length of manifold 60 and includes a conductive material which in response to an electrical current will produce heat. When an electrical current runs lengthwise through aperture plate 40, aperture plate 40 will produce heat. The coupling by insulator 120 will allow side walls 55 of manifold 60 to absorb heat from aperture plate 40 in the regions in which they are coupled. This effect will concentrate heat in the unsupported region adjacent to apertures 90, which will be preferentially heated by virtue of the reduced cross sectional area of the heater and the lack of a thermal sink in this area. Thus, it is possible to heat the unsupported region immediately adjacent to each aperture 90 to a slightly higher temperature than any other portion of aperture plate 40 or manifold 60. This can minimize clogging of apertures 90 by condensing organic material. The emissivity of the external surface of aperture plate 40 and upper manifold 60 are preferably lower than 0.2 so as to minimize the energy radiated toward the substrate. Polished tungsten and tantalum or coatings made of these materials are suitable in this regard.

Figure 5:
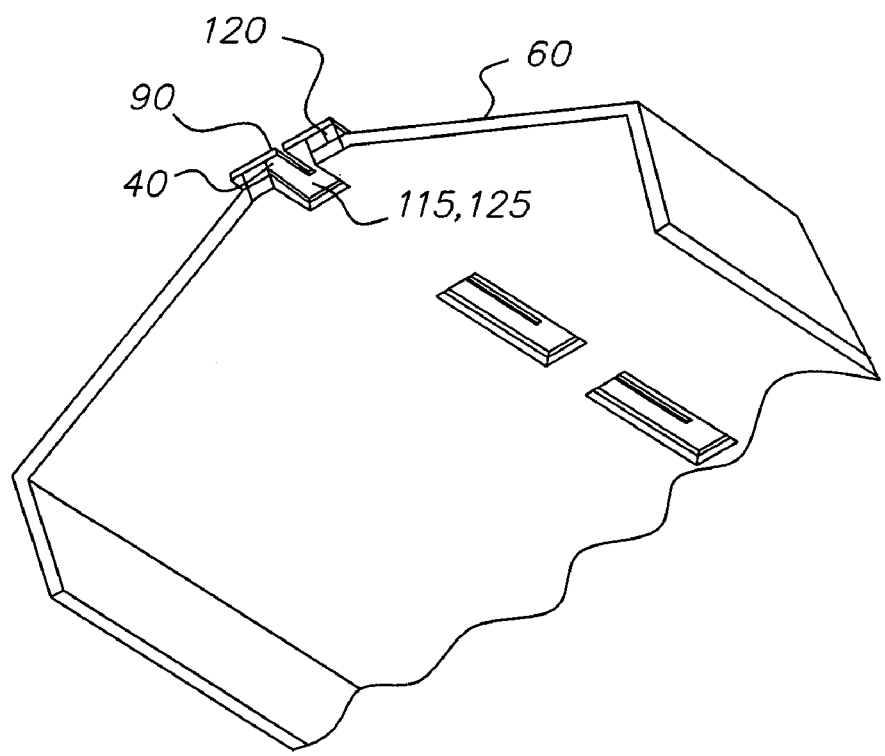
FIG. 5 is a three-dimensional view of the above embodiment of an aperture.

Turning now to FIG. 5, there is shown a three-dimensional view of the above embodiment of an aperture plate according to the present invention. The view is of the upper part of manifold 60 from underneath. A series of manifold apertures 115 runs the length of manifold 60, as well as insulator apertures 125 aligned with manifold apertures 115. Aperture plate 40, which runs the length of manifold 60, includes a series of apertures 90 colinear with manifold apertures 115. Between manifold apertures 115, the full width of aperture plate 40 is attached to manifold 60 by insulator 120. Thus, only the portions of aperture plate 40 immediately adjacent to apertures 90 and manifold apertures 115 will be preferentially heated to a slightly higher temperature.

Figure 6:
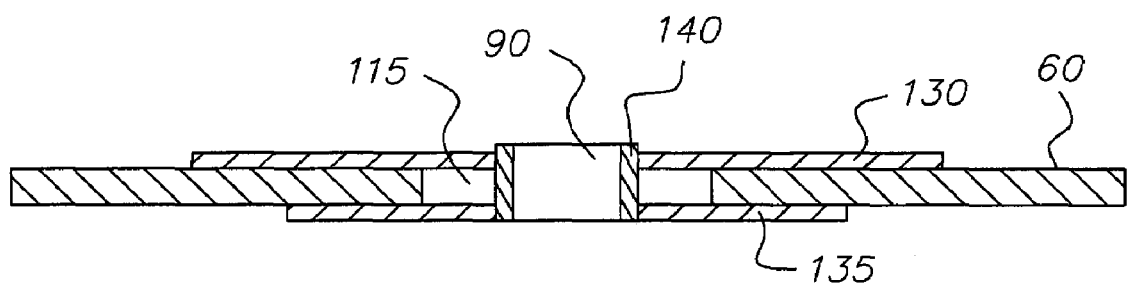
FIG. 6 is a cross-sectional view of another embodiment of an aperture according to the present invention.

FIG. 6 shows another embodiment of the aperture plate according to the present invention. At manifold apertures 115, conductors are located on both inner and outer sides of manifold 60, e.g. an outer conductor 130 and an inner conductor 135. In this embodiment, manifold 60 acts as an insulator, but a separate insulator—on both inside and outside—can be used as in FIG. 4. Via 140 forms the outer wall of aperture 90 and defines aperture 90 in this embodiment. Via 140 includes a conductive material which in response to an electrical current will produce heat. When an electrical current runs e.g. from outer conductor 130 to inner conductor 135 through via 140, aperture 90 will be preferentially heated. This embodiment has the additional advantage that one can optionally make each aperture 90 individually addressable. One can therefore fine-tune the temperature of aperture 90 depending on its location on manifold 60. Individually addressing each aperture 90 allows one to correct for inconsistencies in vapor plume shape that occur along the length of manifold 60.

Figure 7:
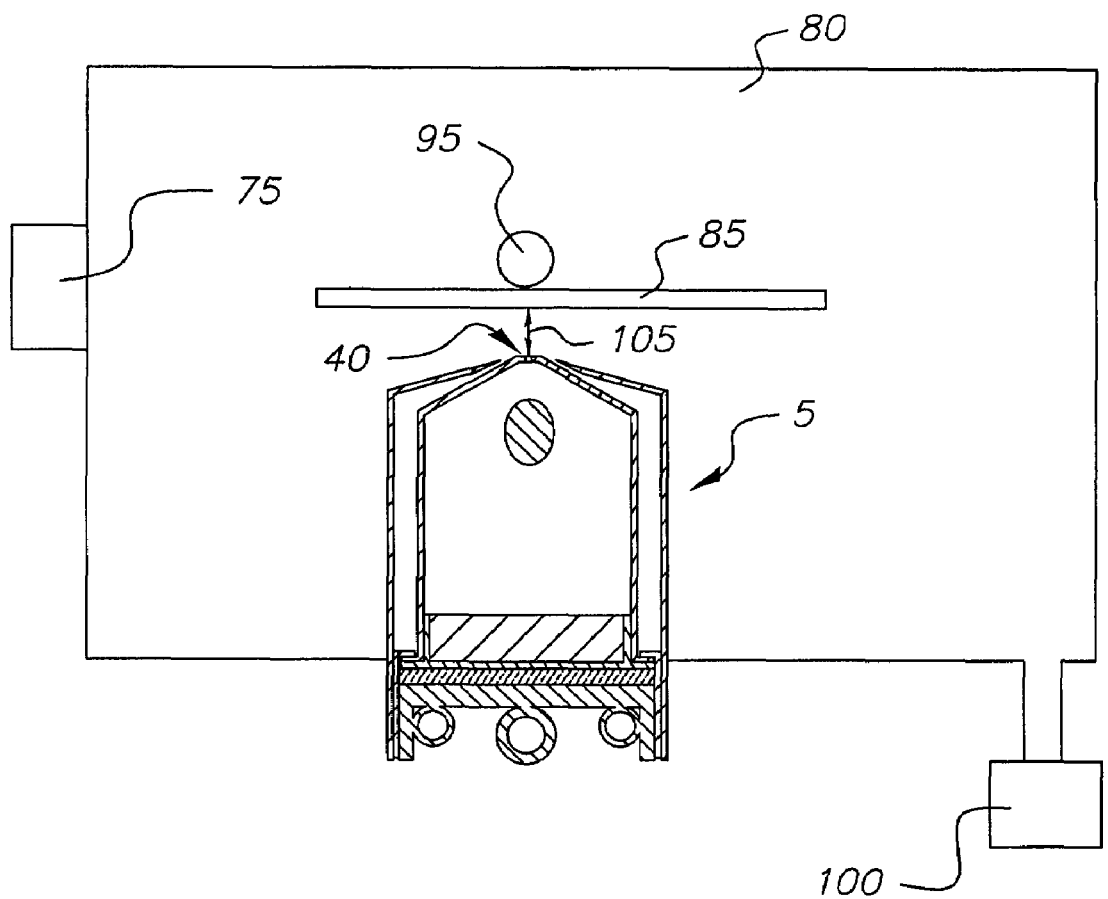
FIG. 7 is a cross-sectional view of a device according to the present invention including a vacuum chamber enclosing a substrate.

Turning now to FIG. 7, there is shown an embodiment of a device according to the present invention including a vacuum chamber enclosing a substrate. Vacuum chamber 80 is an enclosed apparatus that permits an OLED substrate 85, which is a substrate on an OLED device, to be coated with organic material 10 transferred from vapor deposition source 5. Vapor deposition source 5 and the parts thereof, such as manifold 60, are so shaped and placed so that aperture plate 40 is closest to substrate 85. Vacuum chamber 80 is held under controlled conditions, e.g. a pressure of 1 torr or less provided by vacuum source 100. Vacuum chamber 80 includes load lock 75 which can be used to load uncoated OLED substrates 85, and unload coated OLED substrates. OLED substrate 85 can be moved by translational apparatus 95 to provide even coating of vaporized organic material 10 over the entire surface of OLED substrate 85. Although vapor deposition source 5 is shown as partially enclosed by deposition chamber 80, it will be understood that other arrangements are possible, including arrangements wherein vapor deposition source 5 is entirely enclosed by vacuum chamber 80.

The enhancements described herein provide a means whereby the distance between aperture plate 40 and substrate 85 can be reduced, which provides high coating thickness uniformity on substrate 85. Vapor deposition source 5 of this disclosure is designed to project a vapor plume of organic material across a gap of 25 to 50 mm to facing OLED substrate 85. This throw distance 105 is roughly three times closer than prior art devices and allows much better thickness uniformity, and a much higher utilization of the vaporized materials, which translates to a higher deposition rate. The throw distance is sufficiently large that local variations in plume density are averaged over the surface of OLED substrate 85 so as to not degrade the thickness uniformity of the deposited film, and so that the substrate can be sufficiently shielded from radiated heat. At the same time, the throw distance is sufficiently small, that it is possible to achieve thickness uniformity on the order of +/−0.5% without the usual sinusoidal edge variations seen at larger throw distances.

In practice, an OLED substrate 85 is placed in vacuum chamber 80 via load lock 75 and held by translational apparatus 95 or associated apparatus. Vapor deposition source 5 is operated as described above, and translational apparatus 95 moves OLED substrate 85 perpendicular to the direction of emission of organic material 10 vapors from vapor deposition source 5, thus coating an organic layer on the surface of OLED substrate 85.

Figure 8:
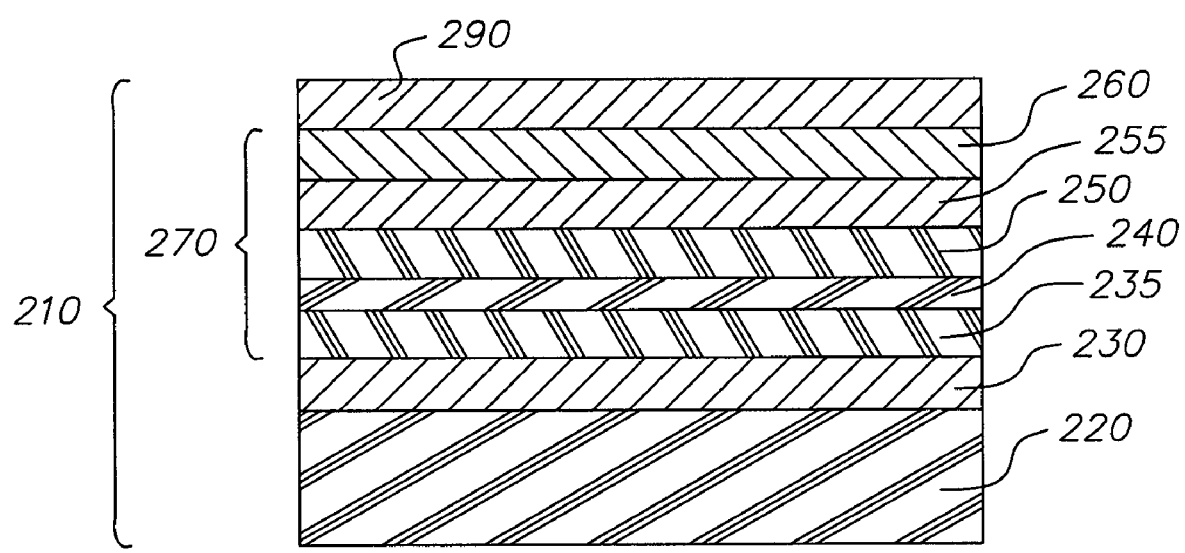
FIG. 8 is a cross-sectional view of an OLED device structure that can be prepared according to the present invention.

Turning now to FIG. 8, there is shown a cross-sectional view of a pixel of a light-emitting OLED device 210 that can be prepared in part according to the present invention. The OLED device 210 includes at a minimum a substrate 220, an cathode 290, an anode 230 spaced from cathode 290, and a light-emitting layer 250. The OLED device can also include a hole-injecting layer 235, a hole-transporting layer 240, an electron-transporting layer 255, and an electron-injecting layer 260. Hole-injecting layer 235, hole-transporting layer 240, light-emitting layer 250, electron-transporting layer 255, and electron-injecting layer 260 include a series of organic layers 270 disposed between anode 230 and cathode 290. Organic layers 270 are the layers most desirably deposited by the device and method of this invention. These components will be described in more detail.

Substrate 220 can be an organic solid, an inorganic solid, or a combination of organic and inorganic solids. Substrate 220 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 220 can be a homogeneous mixture of materials, a composite of materials, or multiple layers of materials. Substrate 220 can be an OLED substrate, that is a substrate commonly used for preparing OLED devices, e.g. active-matrix low-temperature polysilicon or amorphous-silicon TFT substrate. The substrate 220 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 220 and is most commonly configured as an anode 230. When EL emission is viewed through the substrate 220, anode 230 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 235 be formed over anode 230 in an organic light-emitting display. The hole-injecting material can serve to improve the film formation property of subsequent organic layers and to facilitate injection of holes into the hole-transporting layer. Suitable materials for use in hole-injecting layer 235 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 240 be formed and disposed over anode 230. Desired hole-transporting materials can be deposited by any suitable means such as evaporation, sputtering, chemical vapor deposition, electrochemical means, thermal transfer, or laser thermal transfer from a donor material, and can be deposited by the device and method described herein. Hole-transporting materials useful in hole-transporting layer 240 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or including at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

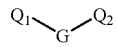

A wherein:
Q$_1$ and Q$_2$ are independently selected aromatic tertiary amine moieties; and
G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

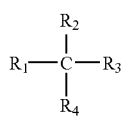

B where:
R$_1$ and R$_2$ each independently represent a hydrogen atom, an aryl group, or an alkyl group or R$_1$ and R$_2$ together represent the atoms completing a cycloalkyl group; and R$_3$ and R$_4$ each independently represent an aryl group, which is in turn substituted with a diaryl substituted amino group, as indicated by structural Formula C.

C wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

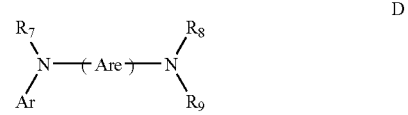

D wherein:
each Are is an independently selected arylene group, such as a phenylene or anthracene moiety;
n is an integer of from 1 to 4; and
Ar, R$_7$, R$_8$, and R$_9$ are independently selected aryl groups.
In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. The device and method described herein can be used to deposit single- or multi-component layers, and can be used to sequentially deposit multiple layers.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 250 produces light in response to hole-electron recombination. Light-emitting layer 250 is commonly disposed over hole-transporting layer 240.

Desired organic light-emitting materials can be deposited by any suitable means such as evaporation, sputtering, chemical vapor deposition, electrochemical means, or radiation thermal transfer from a donor material, and can be deposited by the device and method described herein. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. The device and method described herein can be used to coat multi-component guest/host layers without the need for multiple vaporization sources.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

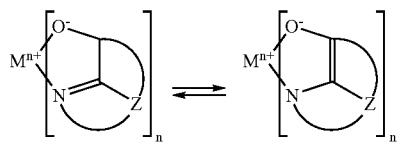

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in light-emitting layer 250 can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2, 2', 2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distyrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful that OLED device 210 includes an electron-transporting layer 255 disposed over light-emitting layer 250. Desired electron-transporting materials can be deposited by any suitable means such as evaporation, sputtering, chemical vapor deposition, electrochemical means, thermal transfer, or laser thermal transfer from a donor material, and can be deposited by the device and method described herein. Preferred electron-transporting materials for use in electron-transporting layer 255 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

An electron-injecting layer 260 can also be present between cathode 290 and electron-transporting layer 255. Examples of electron-injecting materials include alkaline or alkaline earth metals, alkali halide salts, such as LiF mentioned above, or alkaline or alkaline earth metal doped organic layers.

Cathode 290 is formed over the electron-transporting layer 255 or over light-emitting layer 250 if an electron-transporting layer is not used. When light emission is through the anode 230, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through cathode 290, it must be transparent or nearly transparent. For such applications, metals must be thin or one must use transparent conductive oxides, or a combination of these materials. Optically transparent cathodes have been described in more detail in U.S. Pat. No. 5,776,623.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The invention has been described in detail with particular reference to certain preferred embodiments thereof, but it will be understood that variations and modifications can be effected within the spirit and scope of the invention.

PARTS LIST 5 vapor deposition source
10 organic material
15 vapor deposition source
20 base block
25 heater
30 control passage
35 seal area
40 aperture plate
45 chamber
50 heating element
52 shroud
55 side wall
60 manifold
65 bottom wall
70 radiation shield
75 load lock
80 vacuum chamber
85 OLED substrate
90 aperture
95 translational apparatus
100 vacuum source
105 throw distance
110 heating element
115 manifold aperture
120 insulator
125 insulator aperture
130 outer conductor
135 inner conductor
140 via
210 OLED device
220 substrate
230 anode
235 hole-injecting layer
240 hole-transporting layer
250 light-emitting layer
255 electron-transporting layer
260 electron-injecting layer
270 organic layers
290 cathode

The invention claimed is:

1. A method for coating an organic layer onto a substrate in a vacuum chamber comprising:
    (a) providing a manifold including side and bottom walls defining a chamber for receiving organic material, and an aperture plate disposed between the side walls, the aperture plate having a plurality of spaced apart apertures for emitting vaporized organic material; the aperture plate including conductive material which in response to an electrical current produces heat;
    (b) heating the organic material to a temperature which causes its vaporization, and heating the side walls of the manifold, the aperture plate includes a first aperture plate emissive surface that radiates energy into the chamber and a second aperture plate emissive surface that radiates less energy to the substrate wherein the second aperture niate emissive surface has an emissivity lower than the first aperture plate emissive surface; and
    (c) concentrating heat in an unsupported region of the aperture plate adjacent to the apertures by providing an electrical insulator coupling the aperture plate to the side walls.

2. The method of claim 1 including shaping the manifold so that the aperture plate is closest to the substrate.

3. The method of claim 2 further including a radiation shield spaced closely to the apertures to reduce the area of the manifold radiating energy to the substrate while reducing the risk of the shield becoming covered with condensed organic material.

4. The method of claim 1 wherein the region immediately adjacent to each aperture is heated to a slightly higher temperature than any other portion of the aperture plate or manifold to reduce clogging of the apertures.

5. The method of claim 1 includes heating the bulk of the organic material to a temperature below its vaporization temperature, and heating the lower portion of the manifold.

6. The method of claim 1 further including providing a first manifold emissive surface on the manifold that radiates energy into the chamber and a second manifold emissive surface on the manifold that radiates energy outside of the chamber wherein the emissivity of the first manifold emissive surface is greater than theemissivity of the second manifold surface.

* * * * *